US012031735B2

(12) United States Patent
Maune et al.

(10) Patent No.: US 12,031,735 B2
(45) Date of Patent: Jul. 9, 2024

(54) DAMPER INSPECTION SYSTEMS AND METHODS

(71) Applicant: Air Distribution Technologies IP, LLC, Milwaukee, WI (US)

(72) Inventors: Kent Steven Maune, Independence, MO (US); Michael Anthony Coyazo, Overland Park, KS (US); Jeffrey Scott Beneke, Peculiar, MO (US); Rahul Ashokrao Tambakhe, Pune (IN); Ujjain Kumar Bidila, Hyderabad (IN); Anup Tejkumar Kole, Sangli (IN); Vihari Venkata Vidya Andukuri, Pune (IN)

(73) Assignee: Air Distribution Technologies IP, LLC, Milwaukee, WI (US)

( * ) Notice: Subject to any disclaimer, the term of this patent is extended or adjusted under 35 U.S.C. 154(b) by 277 days.

(21) Appl. No.: 17/344,589

(22) Filed: Jun. 10, 2021

(65) Prior Publication Data

US 2022/0397300 A1     Dec. 15, 2022

(51) Int. Cl.
*F24F 11/49*     (2018.01)
*F24F 11/74*     (2018.01)
(Continued)

(52) U.S. Cl.
CPC .............. *F24F 11/49* (2018.01); *F24F 11/74* (2018.01); *F24F 11/88* (2018.01); *G01R 31/74* (2020.01)

(58) Field of Classification Search
CPC ...................................................... F24F 11/49
(Continued)

(56) References Cited

U.S. PATENT DOCUMENTS

| 4,404,613 A * | 9/1983 | Channing ............ H01H 47/002 |
| | | 126/285 B |
| 4,545,363 A | 10/1985 | Barchechat et al. |

(Continued)

FOREIGN PATENT DOCUMENTS

| CN | 2390630 Y | 8/2000 |
| EP | 3235546 A1 | 10/2017 |

OTHER PUBLICATIONS

When Design Matters—Electro-Balance Battery Powered Balancing Dampers, Metropolitan Air Technology, 2017, 10 pgs, https://metairtech.com/products/remotely-operated-balancing-dampers/electro-balance-battery-powered-dampers/#eb-200.
(Continued)

*Primary Examiner* — Vincent Q Nguyen
(74) *Attorney, Agent, or Firm* — Fletcher Yoder, PC

(57) ABSTRACT

A damper inspection system for a heating, ventilating, and air conditioning (HVAC) system includes a fuse link sensor configured to couple to a damper. The fuse link sensor includes a first contact and a second contact. The fuse link sensor is configured to transition between an engaged configuration in which the first contact is electrically coupled to the second contact and a disengaged configuration in which the first contact is electrically decoupled from the second contact. The damper inspection system includes a remote controller that includes control circuitry configured to electrically couple to the first contact and the second contact and to determine an operational status of a fuse link of the damper based on an electrical continuity between the first contact and the second contact.

20 Claims, 12 Drawing Sheets

(51) Int. Cl.
*F24F 11/88* (2018.01)
*G01R 31/74* (2020.01)

(58) Field of Classification Search
USPC .......................................................... 324/550
See application file for complete search history.

(56) References Cited

U.S. PATENT DOCUMENTS

| | | | | |
|---|---|---|---|---|
| 4,698,589 | A * | 10/1987 | Blankenship | .......... G01R 31/50 |
| | | | | 365/96 |
| 5,576,581 | A | 11/1996 | Iannuzzi et al. | |
| 7,241,218 | B2 | 7/2007 | Van Becelaere et al. | |
| 9,981,529 | B2 | 5/2018 | Waseen et al. | |
| 10,446,488 | B1 * | 10/2019 | Sherrima | ............. H05K 3/4038 |
| 10,982,876 | B2 | 4/2021 | Edwards et al. | |
| 2011/0069961 | A1 * | 3/2011 | Hudson | ................ H04B 10/114 |
| | | | | 398/115 |
| 2014/0203090 | A1 | 7/2014 | Edwards et al. | |
| 2015/0102895 | A1 * | 4/2015 | Kondo | ............... H01H 85/2015 |
| | | | | 337/186 |
| 2018/0087799 | A1 * | 3/2018 | Pridemore | ............. F24F 12/00 |
| 2018/0311519 | A1 | 11/2018 | Jenks et al. | |
| 2021/0075207 | A1 * | 3/2021 | McCasland | ........ G01R 31/3277 |

OTHER PUBLICATIONS

ZRC020—Hand-held Remote Control, Ruskin—Authority in Air Control, 2011, 3 pgs, https://www.ruskin.com/model/zrc020.

* cited by examiner

# DAMPER INSPECTION SYSTEMS AND METHODS

BACKGROUND

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Heating, ventilation, and air conditioning (HVAC) systems are utilized in residential, commercial, and industrial environments to control environmental properties, such as temperature and humidity, for occupants of the respective environments. The HVAC system may regulate the environmental properties through delivery of a conditioned air flow to the environment. For example, the HVAC system generally includes an HVAC unit that is fluidly coupled to various rooms or spaces within the building via an air distribution system, such as a system of ductwork. The HVAC unit may be operable to direct a conditioned air flow (e.g., heated air, cooled air, dehumidified air) through the ductwork and into the spaces to be conditioned. In this manner, the HVAC unit facilitates regulation of environmental parameters within the rooms or spaces of the building.

Generally, dampers are positioned within and/or form a portion of the ductwork and are used to regulate fluid flow along the ductwork. For example, the dampers can include adjustable dampers that are configured to control a flow rate of the conditioned air supplied to various rooms, zones, or other spaces within the building during operation of the HVAC system. Additionally or alternatively, the dampers can include dampers that are configured to automatically transition to a closed configuration to block fluid flow along the ductwork in response to a temperature within or near the ductwork exceeding a threshold value. Typically, a technician may inspect the dampers between certain time intervals to confirm a current setting of the dampers and/or evaluate an operational functionality of the dampers. For example, the technician may check whether the dampers are adjusted to particular positions or configurations and/or may confirm that components of the damper have a desired operational functionality. Generally, such inspection of the dampers involves the technician traveling to a physical location of the damper (e.g., via a crawl space above a ceiling or below a floor of a room or zone serviced by the damper) to complete the inspection. It is now recognized that completion of typical damper inspections may therefore be arduous and time consuming.

SUMMARY

The present disclosure relates to a damper inspection system for a heating, ventilating, and air conditioning (HVAC) system. The damper inspection system includes a fuse link sensor configured to couple to a damper. The fuse link sensor includes a first contact and a second contact. The fuse link sensor is configured to transition between an engaged configuration in which the first contact is electrically coupled to the second contact and a disengaged configuration in which the first contact is electrically decoupled from the second contact. The damper inspection system includes a remote controller that includes control circuitry configured to electrically couple to the first contact and the second contact and to determine an operational status of a fuse link of the damper based on an electrical continuity between the first contact and the second contact.

The present disclosure also relates to a heating, ventilating, and air conditioning (HVAC) system that includes a damper. The damper includes a fuse link sensor coupled to a linkage of the damper. A first body portion of the fuse link sensor is engaged with a second body portion of the fuse link sensor in an engaged configuration of the fuse link sensor. The damper also includes a fuse link coupled to the linkage, where the fuse link is configured to rupture to enable the linkage to disengage the first body portion from the second body portion to transition the fuse link sensor to a disengaged configuration. The HVAC system also includes a remote controller that includes control circuitry configured to output an indication that the fuse link is in a ruptured state in response to a determination that the fuse link sensor is in the disengaged configuration.

The present disclosure also relates to a damper inspection system for a heating, ventilating, and air conditioning (HVAC) system. The damper inspection system includes a fuse link sensor configured to transition from an engaged configuration to a disengaged configuration upon rupture of a fuse link of a damper. The damper inspection system also includes a communication port electrically coupled to the fuse link sensor and configured to couple to a support structure. The damper inspection system further includes a remote controller configured to electrically couple to the fuse link sensor via the communication port, where the remote controller includes control circuitry configured to determine a connection state of the fuse link based on feedback from the fuse link sensor.

DETAILED DESCRIPTION

Figure 1:
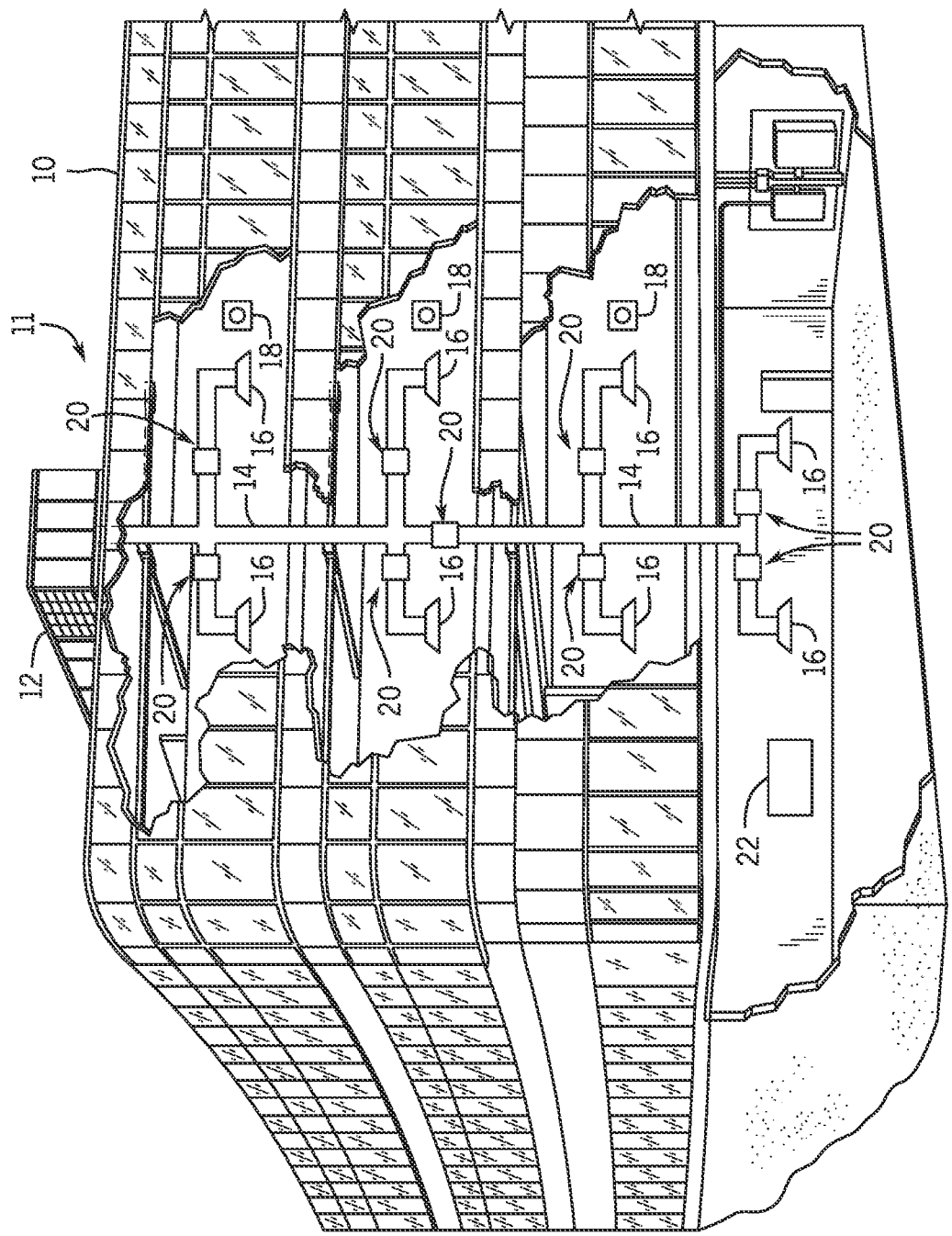
FIG. 1 is a perspective view of an embodiment of a building that may utilize a heating, ventilation, and/or air conditioning (HVAC) system in a commercial setting, in accordance with an aspect of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As briefly discussed above, a heating, ventilation, and/or air conditioning (HVAC) system may be used to thermally regulate a space within a building, home, or other suitable structure. The HVAC system may include an HVAC unit configured to condition an air flow via an evaporator, a furnace, a heating coil, a chiller system, other components, or a combination thereof, and to provide the conditioned air flow (e.g., a heated air flow, a cooled air flow, a dehumidified air flow) to the space. For example, the HVAC unit may be fluidly coupled to the space via an air distribution system, such as a system of ductwork, which extends between the HVAC unit and the space. As such, one or more fans or blowers of the HVAC system may be operable to direct a supply of conditioned air from the HVAC unit, through the ductwork, and into the spaces within the building.

Typically, the HVAC system includes one or more dampers that are disposed within the ductwork and are configured to regulate fluid flow along the ductwork. For example, the dampers may include adjustable dampers that are set to particular positions (e.g., manually, via an actuator of the dampers) to achieve a desired flow rate of conditioned air to the room, zone, or other space serviced by the dampers. In some embodiments, the dampers can include fire dampers that are configured to transition to a closed configuration to block fluid flow (e.g., air, smoke) along the ductwork in response to a temperature within or near the ductwork exceeding or approaching a threshold value.

For example, each fire damper may include one or more damper blades (e.g., louvers) that are configured to transition between respective open positions to unblock a flow path through a damper frame (e.g., housing) of the damper and respective closed positions to block the flow path through the damper frame. As such, a particular fire damper may selectively enable or block (e.g., substantially inhibit) fluid flow through the damper frame and along the ductwork via adjustment of the damper blades between the open and closed positions, for example. As discussed in detail herein, the fire damper may include a biasing mechanism (e.g., a spring) that is coupled to the damper blades (e.g., via a mechanical linkage) and is configured to apply a force on the damper blades that biases the damper blades toward the closed positions. The fire damper generally includes a thermally activated fusible link, also referred to herein as a fuse link, that, in a connected state, is configured to counter-act the biasing force applied by the biasing mechanism on the damper blades. In this way, the fuse link may, while in the connected state, retain the damper blades in the open positions (e.g., during normal operation of the HVAC system), even though the biasing mechanism applies and maintains the biasing force on the damper blades.

In some cases, combustion within or near the ductwork may cause a temperature within the ductwork to rise above a value that is sufficient to cause the fuse link to weaken or plastically deform. As a result, the biasing force applied by the biasing mechanism to the fuse link and the damper blades may cause the fuse link to break apart (e.g., rupture, fracture), such that the fuse link transitions to a disconnected state (e.g., a ruptured state), in which the fuse link is severed into two or more pieces and is no longer capable of counter-acting the biasing force applied by the biasing mechanism on the damper blades. Accordingly, the biasing mechanism may, via application of the biasing force, transition the damper blades from the open positions to the closed positions to block fluid flow across or through the damper. In this manner, the fire damper may inhibit fluid flow along the ductwork in response to the temperature within the ductwork (e.g., near a section of the ductwork having the fire damper) exceeding the threshold temperature value.

In some cases, it may be desirable to perform an inspection on one or more components of the dampers (e.g., components of the fire dampers) to evaluate an operational state of the components and/or to verify an operational functionality of the components. As an example, it may be desirable to determine a current position of damper blades of the damper, to cycle the damper between a fully open configuration and a fully closed configuration to verify a range of motion or positional range of the damper blades, to determine a state (e.g., connected, disconnected) of the fuse link of the damper (e.g., fire damper), and/or to otherwise inspect or adjust another component or functionality of the damper. Typically, performance of such inspections involves a technician traveling to a physical location of the damper (e.g., via a crawl space above a ceiling or below a floor of a room or zone serviced by the damper) to evaluate the operational state and/or operational functionality of the damper. As a result, completion of the damper inspections is often arduous and time consuming.

It is presently recognized that enabling remote inspection of the dampers may reduce a complexity involved in performing inspection of the dampers and, thus, reduce a time period and cost that may be associated with completing the inspection. Accordingly, embodiments of the present disclosure relate to a damper inspection system that enables a technician to remotely inspect a damper (e.g., evaluate the operational state and/or operational functionality of the damper) without having to travel to a location of the damper to physically interact with (e.g., adjust, manipulate) the damper.

For example, the damper inspection system includes a communication system (e.g., a wired communication system) that enables the technician to selectively establish communication between the components of the damper (e.g., an actuator, one or more sensors) and a portable electronic device (e.g., an analog device, a digital device), referred to herein as a remote controller, that may be carried, held, and/or used by the technician. Particularly, as discussed in detail herein, the communication system is configured to electrically couple certain damper components to the remote controller, such that the technician may utilize the remote controller to verify an operational status and/or functionality of one or more components of the damper. As a non-limiting example, the remote controller may include control circuitry (e.g., analog control circuitry) that is configured to communicate with (e.g., via the communication system and based on user input from the technician) an actuator of the damper to instruct the actuator to verify a range of motion or positions of the damper blades of the damper. Additionally or alternatively, the control circuitry may communicate with a fuse link sensor that is coupled to the damper and is configured to provide the remote controller with feedback indicative of an operational state (e.g. connected, disconnected) of the fuse link of the damper. These and other features will be described below with reference to the drawings.

Turning now to the drawings, FIG. 1 illustrates an embodiment of a heating, ventilation, and/or air conditioning (HVAC) system for environmental management that may employ one or more HVAC units. As used herein, an HVAC system includes any number of components configured to enable regulation of parameters related to climate characteristics, such as temperature, humidity, air flow, pressure, air quality, and so forth. For example, an "HVAC system" as used herein is defined as conventionally understood and as further described herein. Components or parts of an "HVAC system" may include, but are not limited to, all, some of, or individual parts such as a heat exchanger, a heater, an air flow control device, such as a fan, a sensor configured to detect a climate characteristic or operating parameter, a filter, a control device configured to regulate operation of an HVAC system component, a component configured to enable regulation of climate characteristics, or a combination thereof. An "HVAC system" is a system configured to provide such functions as heating, cooling, ventilation, dehumidification, pressurization, refrigeration, filtration, or any combination thereof. The embodiments described herein may be utilized in a variety of applications to control climate characteristics, such as residential, commercial, industrial, transportation, or other applications where climate control is desired.

In the illustrated embodiment, a building 10 is air conditioned by an HVAC system 11 having an HVAC unit 12. The building 10 may be a commercial structure or a residential structure. As shown, the HVAC unit 12 is disposed on the roof of the building 10; however, the HVAC unit 12 may be located in other equipment rooms or areas adjacent the building 10. The HVAC unit 12 may be a single package unit containing other equipment, such as a blower, integrated air handler, and/or auxiliary heating unit. In other embodiments, the HVAC unit 12 may be part of a split HVAC system, which includes an outdoor HVAC unit and an indoor HVAC unit.

The HVAC unit 12 is an air cooled device that implements a refrigeration cycle to provide conditioned air to the building 10. Specifically, the HVAC unit 12 may include one or more heat exchangers across which an air flow is passed to condition the air flow before the air flow is supplied to the building 10. In the illustrated embodiment, the HVAC unit 12 is a rooftop unit (RTU) that conditions a supply air stream, such as environmental air and/or a return air flow from the building 10. The HVAC unit 12 may provide a variety of heating and/or cooling functions, such as cooling only, heating only, cooling with electric heat, cooling with dehumidification, cooling with gas heat, or cooling with a heat pump. For example, in certain embodiments, the HVAC unit 12 may be a heat pump that provides both heating and cooling to the building with one refrigeration circuit configured to operate in different modes. In other embodiments, the HVAC unit 12 may include one or more refrigeration circuits for cooling an air stream and a furnace for heating the air stream.

In any case, after the HVAC unit 12 conditions the air, the air may be supplied to the building 10 via ductwork 14 extending from the HVAC unit 12 and throughout the building 10. For example, the ductwork 14 may extend to various individual floors, rooms zones, or other sections or spaces of the building 10. In some embodiments, a plurality of diffuser assemblies 16 are coupled to the ductwork 14. The diffuser assemblies 16 may direct the conditioned air received from the ductwork 14 into the various spaces of the building 10 in a manner that improves air distribution and/or air dispersion across the spaces.

In some embodiments, a control device 18, one type of which may be a thermostat, may be used to designate the temperature of the conditioned air supplied by the HVAC unit 12. The control device 18 also may be used to control the flow of air through the ductwork 14. For example, the control device 18 may be used to regulate operation of one or more components of the HVAC unit 12 or other components, such as dampers and fans, within the building 10 that may control flow of air through and/or from the ductwork 14. In some embodiments, other devices may be included in the system, such as pressure and/or temperature transducers or switches that sense the temperatures and pressures of supply air, return air, and so forth. Moreover, the control device 18 may include computer systems that are integrated with or separate from other building control or monitoring systems, and even systems that are remote from the building 10.

In the illustrated embodiment, the HVAC system 11 includes a plurality of damper assemblies 20 (e.g., dampers) that are coupled to the ductwork 14 and/or form a portion of the ductwork 14 and are configured to regulate fluid flow through the ductwork 14. For example, the damper assemblies 20 may include one or more dampers configured to regulate distribution of a flow of conditioned air generated by the HVAC unit 12 to one or more rooms, zones, or other spaces within the building 10. Additionally or alternatively, the damper assemblies 20 may include one or more fire dampers that, as discussed in detail herein, are each configured to block fluid flow along a respective portion of the ductwork 14 in response thermal input (e.g., heat) applied to the corresponding fire damper. The HVAC system 11 includes a damper inspection system 22 that facilitates inspection of the damper assemblies 20 in accordance with the techniques discussed herein.

Figure 2:
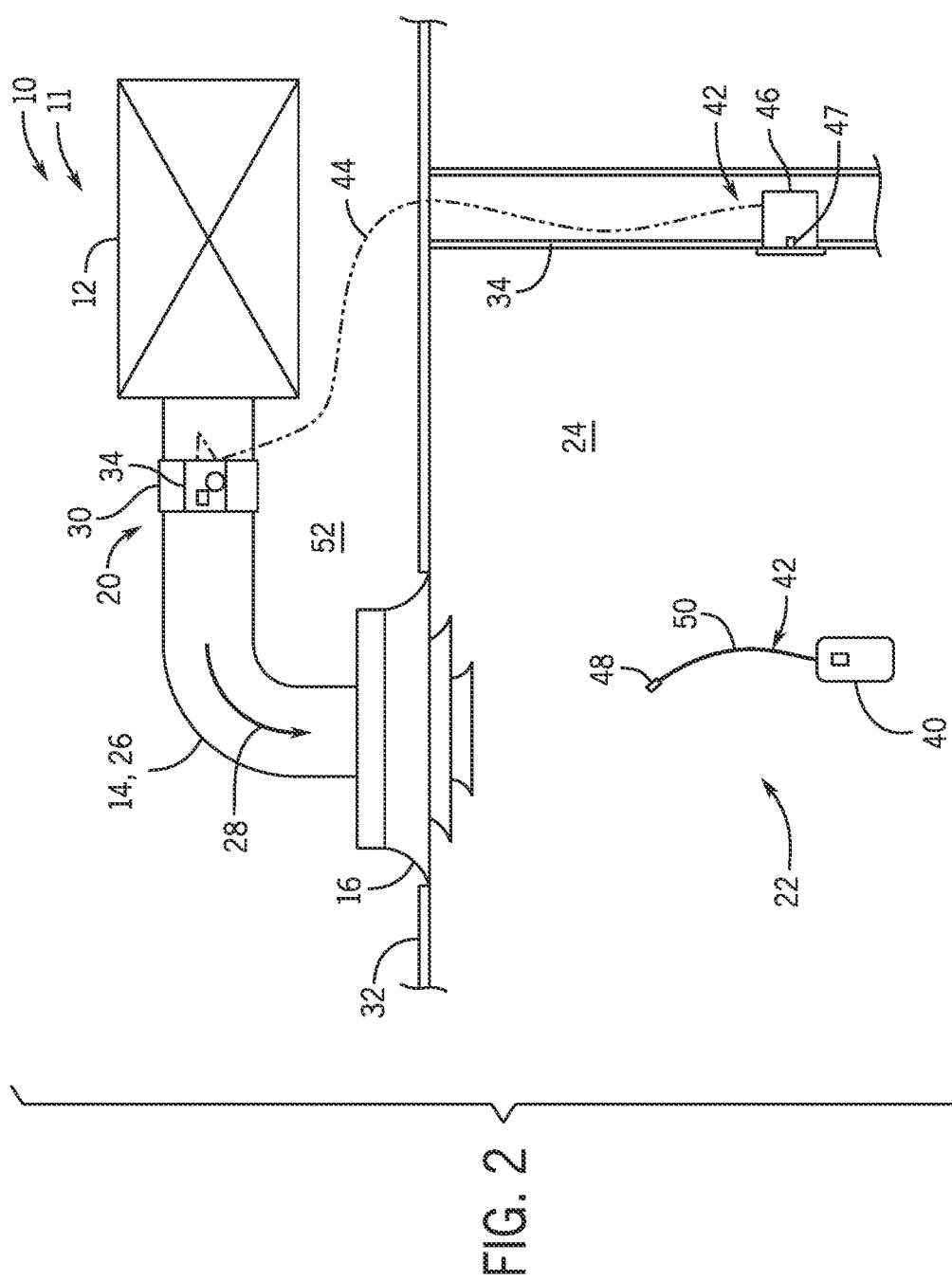
FIG. 2 is a schematic of an embodiment of a portion of an HVAC system that includes a damper inspection system, in accordance with an aspect of the present disclosure.

FIG. 2 is a schematic of an embodiment of a portion of the building 10 and of the HVAC system 11. As discussed above, the HVAC unit 12 is configured to condition an air flow that is supplied to a space 24 within the building 10, which may include a room, a zone, a floor, and/or another suitable region within the building 10. The ductwork 14 may include a supply air duct 26 that directs a flow of conditioned air 28 from the HVAC unit 12, through the diffuser assembly 16, and into the space 24. In the illustrated embodiment, the HVAC system 11 includes a damper 30 (e.g., one of the damper assemblies 20) that may regulate flow the conditioned air 28 along the supply air duct 26. Although the damper 30 and the supply air duct 26 are positioned above a ceiling 32 of the space 24 (e.g., with respect to gravity) in the illustrated embodiment of FIG. 2, it should be understood that, in other embodiments, the damper 30, the supply air duct 26, or both, may be positioned below a floor of the space 24 (e.g., with respect to gravity), behind another suitable wall structure (e.g., a wall 33) of the space 24, and/or within the space 24.

The damper 30 may include a monitoring assembly 34 (e.g., monitoring system) that forms a portion of the damper inspection system 22. As discussed in detail below, the monitoring assembly 34 may include a fuse link sensor configured to monitor a status of a fuse link of the damper 30, an actuator configured to adjust a position of one or more louvers (e.g., damper blades) of the damper 30, and/or other suitable components that may facilitate monitoring the operational functionality of the damper 30 and/or adjusting the operation of the damper 30.

In the illustrated embodiment, the damper inspection system 22 includes a remote controller 40 (e.g., a portable electronic device) that, as discussed herein, enables a user (e.g., a technician) to perform an inspection of the damper 30 via the damper inspection system 22. The damper inspection system 22 includes a communication system 42 (e.g., a harness) that facilitates electrically coupling and/or communicatively coupling (e.g., via a wired connection or a wireless connection) between the remote controller 40 and the monitoring assembly 34. For example, in some embodiments, the communication system 42 includes one or more wires 44 (e.g., copper wires, fiber optics) that may extend from the monitoring assembly 34 to a communication port 46 of the damper inspection system 22. The communication port 46 may include a connector 47 (e.g., a female connector) that is configured to engage with a jack 48 (e.g., a male connector) of a cable 50 of the remote controller 40. As such, engagement of the jack 48 with the connector 47 may electrically and/or communicatively couple the remote controller 40 to the monitoring assembly 34.

It should be appreciated that the communication port 46 may be disposed within and/or coupled to the wall 33, the ceiling 32, the diffuser assembly 16, or the floor of the space 24, for example. In any case, the communication system 42 enables the transfer of control signals, data signals (e.g., analog signals, digital signals), or both, between the monitoring assembly 34 and the remote controller 40. As discussed in detail below, the remote controller 40 enables a technician to perform an inspection on the damper 30 without traveling to a physical location of the damper 30, such as to a crawl space 52 that may be located above the ceiling 32 (e.g., with respect to gravity).

In certain embodiments, the communication system 42 may include one or more wireless communication devices that enable wireless communication between the remote controller 40 and the monitoring assembly 34. For example, the communication system 42 may include a network interface that enables the components of the HVAC system 11 and/or components of the damper inspection system 22 to communicate via various protocols such as EtherNet/IP, ControlNet, DeviceNet, or any other communication network protocol. Alternatively, the communication system 42 may enable the components of the HVAC system 11 and/or of the damper inspection system 22 to communicate via mobile telecommunications technology, Bluetooth®, near-field communications technology, and the like.

Figure 3:
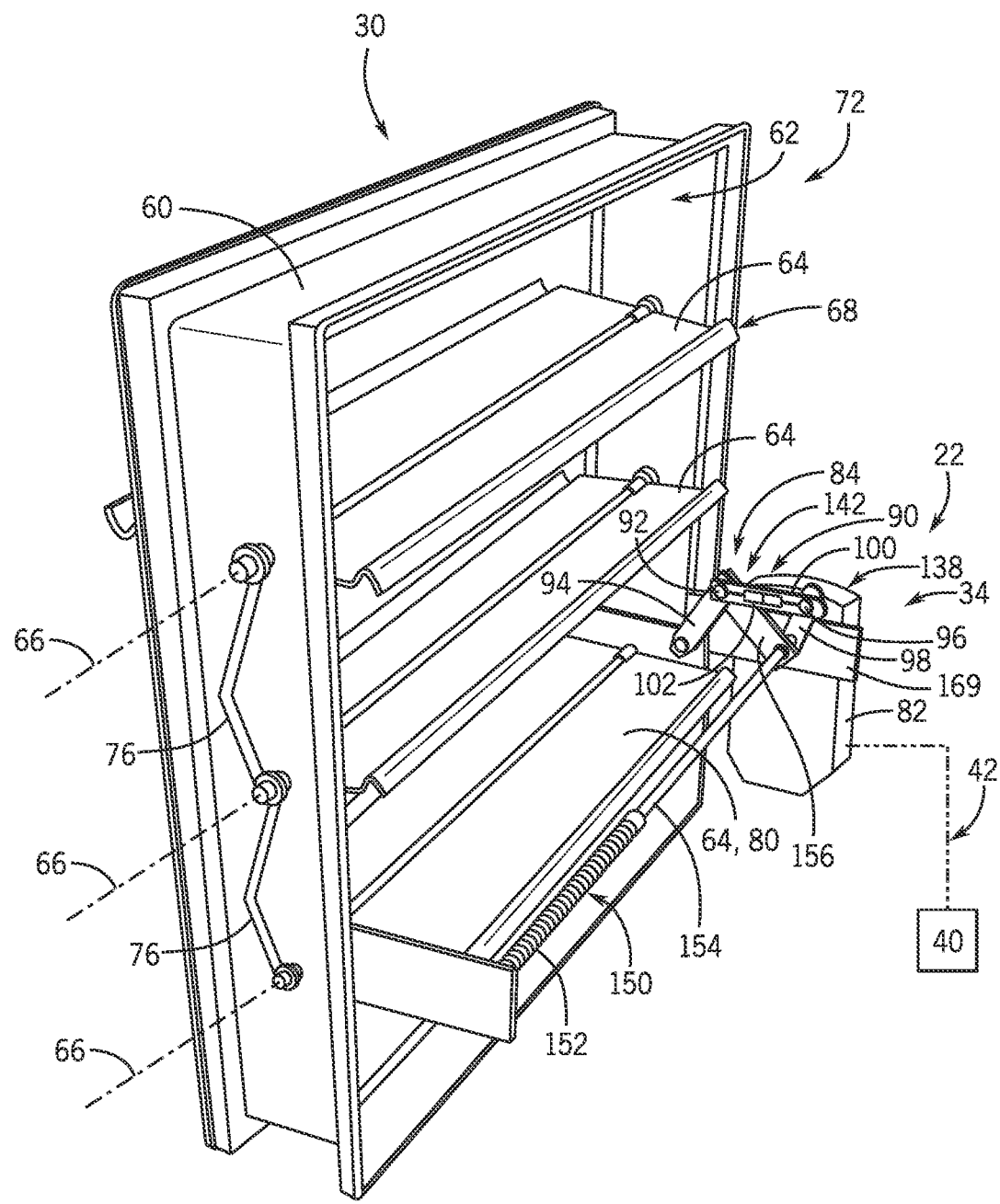
FIG. 3 is a perspective view of an embodiment of a damper and a damper inspection system, in accordance with an aspect of the present disclosure.

FIG. 3 is a perspective view of an embodiment of the damper 30, also referred to herein as a fire damper 30, and of a portion of the damper inspection system 22. As shown in the illustrated embodiment, the fire damper 30 includes a frame 60 that defines a flow path 62 through the fire damper 30. One or more louvers or blades 64 (e.g., damper blades) are pivotably coupled to the frame 60 and configured to pivot about respective axes 66 between open positions 68 and closed positions 70 (see FIG. 7). As such, the louvers 64 enable the fire damper 30 to transition between an open configuration 72, in which the louvers 64 are in the open positions 68 to expose the flow path 62 and enable fluid flow along the flow path 62, and a closed configuration 74 (see FIG. 7), in which the louvers 64 are in the closed positions 70 to occlude the flow path 62 and inhibit fluid flow along the flow path 62. In some embodiments, a louver linkage 76 may extend between respective shafts of each of the louvers 64. The louver linkage 76 is coupled to the shafts of the louvers 64 such that movement of a particular louver 64 (e.g., a first louver 80) about a corresponding axis 66 induces movement of the remaining louvers 64 about the corresponding axes 66. In other words, movement of one of the louvers 64 may be transferred to remaining louvers 64 of the fire damper 30 via the louver linkage 64.

In some embodiments, the fire damper 30 includes an actuator 82 that may be coupled to one or more of the louvers 64 via a linkage 84. The linkage 84 may include one or more links that extend between an output (e.g., output shaft, gear, etc.) of the actuator 82 and the first louver 80 of the louvers 64, for example. The actuator 82 may be operable to actuate the linkage 84 to transition the first louver 80 and the remaining louvers 64 coupled to the first louver 80 (e.g., via the louver linkage 76) between the open and closed positions 68, 70. As discussed below, in this way, the actuator 82 may be utilized to transition the fire damper 30 between the open configuration 72 and the closed configuration 74 to, for example, test a range of motion and/or a range of positions of the louvers 64.

The linkage 84 may include a fuse link assembly 90 (e.g., a fuse link sensor assembly) that, in the illustrated embodiment of FIG. 3, extends between, for example, a first pin 92 of a first link 94 of the linkage 84 and a second pin 96 of a second link 98 the linkage 84. For clarity, it should be appreciated that, in other embodiments, the fuse link assembly 90 may extend between other suitable components of the linkage 84. That is, the fuse link assembly 90 may not extend from the first pin 92, the second pin 96, or both, and may instead extend from and/or between another suitable component or components of the linkage 84. Indeed, as one of skill in the art will appreciate, various embodiments of the linkage 84 are envisioned and may be implemented with the fuse link assembly 90. In any case, the fuse link assembly 90 may operate in accordance with the techniques discussed herein.

Figure 4:
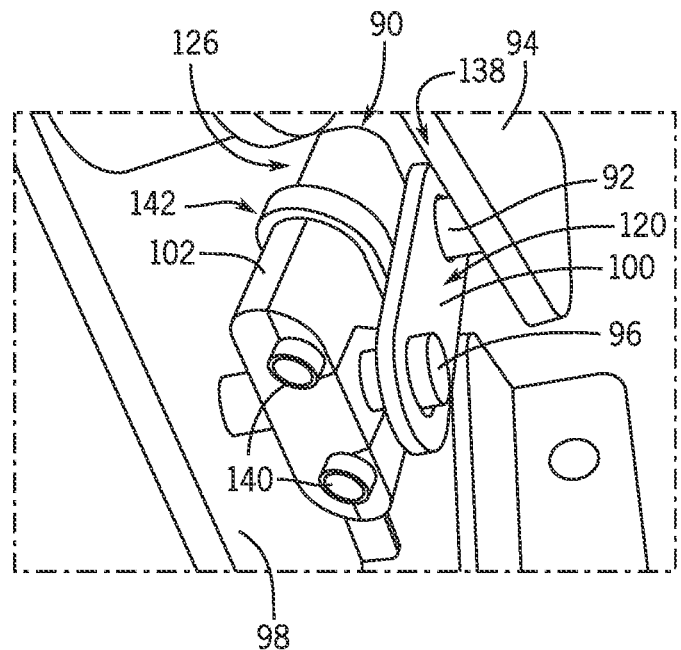
FIG. 4 is a perspective view of an embodiment of a fuse link assembly that may be included in a damper inspection system, in accordance with an aspect of the present disclosure.
Figure 5:
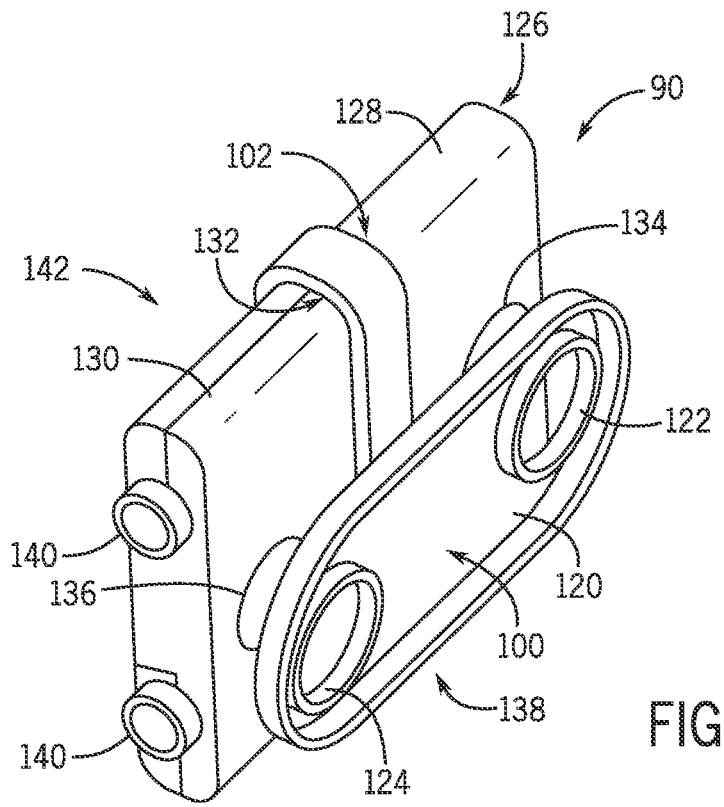
FIG. 5 is a perspective view of an embodiment of a fuse link assembly that may be included in a damper inspection system, in accordance with an aspect of the present disclosure.

In some embodiments, the fuse link assembly 90 includes a fuse link 100 and a fuse link sensor 102. To better illustrate the fuse link assembly 90 and to facilitate the following discussion, FIG. 4 is a perspective view of an embodiment of the fuse link assembly 90 in an installed configuration on the fire damper 30. FIG. 5 is a perspective view of an embodiment of the fuse link assembly 90. The following discussion continues with concurrent reference to FIGS. 4 and 5.

In some embodiments, the fuse link 100 includes a body portion 120 that may couple to and extend between the first pin 92 and the second pin 96 of the linkage 84. For example, in certain embodiments, the fuse link 100 may include a first aperture 122 and a second aperture 124 formed in the body portion 120, where the first aperture 122 is configured to engage with the first pin 92 and the second aperture 124 is configured to engage with the second pin 96. In other words, the first pin 92 may extend through the first aperture 122, and the second pin 96 may extend through the second aperture 124. In the illustrated embodiment, the fuse link 100 is in a connected state 138, in which the fuse link 100 is a single-piece component (e.g., the body portion 120 is not ruptured, severed, split into two or more pieces, or otherwise plastically deformed). In other words, in the connected state 138 of the fuse link 100, the body portion 120 of the fuse link 100 is intact and may extend between the first pin 92 and the second pin 96.

The fuse link sensor 102 includes a sensor body 126 that, as discussed below, may be formed from a first sensor section 128 (e.g., a first body portion) and a second sensor section 130 (e.g., a second body portion) that are removably coupled to one another at an interface 132. In the illustrated embodiments of FIGS. 4 and 5, the fuse link sensor 102 is in an engaged configuration 142, in which the first sensor section 128 is engaged with (e.g., coupled to) the second sensor section 130.

Figure 6:
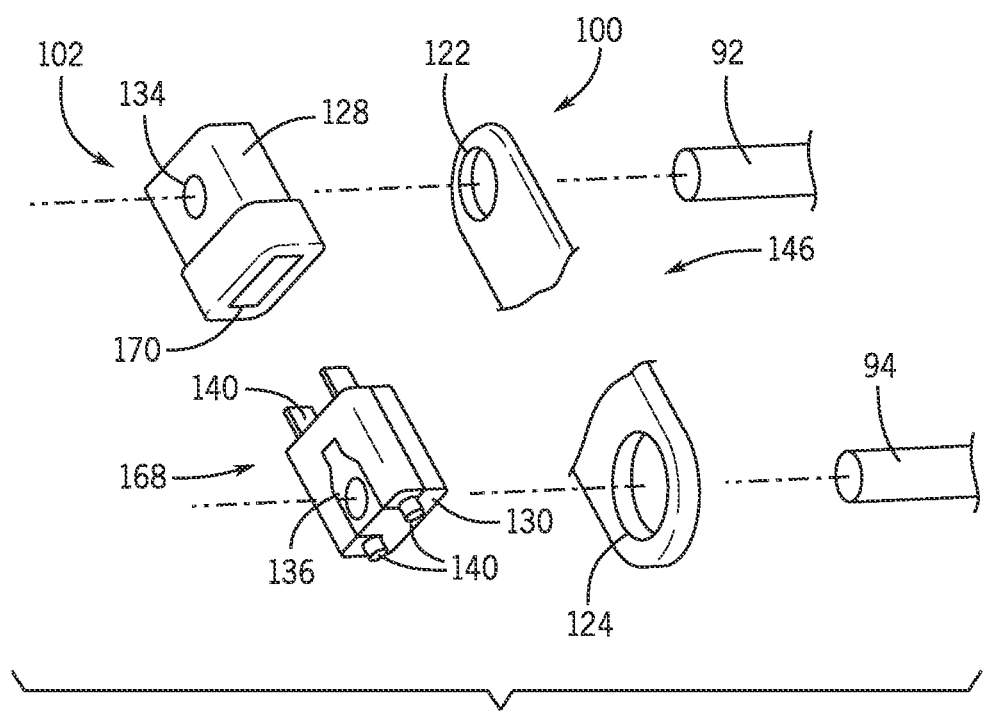
FIG. 6 is an exploded perspective view of an embodiment of a fuse link assembly that may be included in a damper inspection system, in accordance with an aspect of the present disclosure.

Similar to the body portion 120 of the fuse link 100, the sensor body 126 may couple to and extend between the first pin 92 and the second pin 96 of the linkage 84. For example, the first sensor section 128 may include a first aperture 134 formed therein that is configured to engage with the first pin 92, and the second sensor section 130 may include a second aperture 136 formed therein that is configured to engage with the second pin 96. In other words, the first pin 92 may extend through the first aperture 134, and the second pin 96 may extend through the second aperture 136. The fuse link sensor 102 may include connectors 140 that facilitate electrical coupling of the fuse link sensor 102 and the remote controller 40 (e.g., via the communication system 42). As discussed in detail herein, in this way, the fuse link sensor 102 may provide the remote controller 40 with feedback indicative of whether the fuse link 100 is in the connected state 138 or in a disconnected state 146 (see FIG. 6), in which the body portion 120 of the fuse link 100 is severed or plastically deformed. In some instances, in the disconnected state 146, the body portion 120 of the fuse link 100 may be severed into two or more separate pieces, such that the fuse link 100 does not extend continuously between the first pin 92 and the second pin 96.

The following discussion continues with reference to FIG. 3. During normal operation of the HVAC system 11, the actuator 82 may be in an inactive state (e.g., a deactivated state, a powered-down state) and positioned to retain (e.g., passively retain) the louvers 64 in the open positions 68. For example, the actuator 82 may position and retain the second link 98 of the linkage 84 such that the remaining linkage 84 positions the louvers 64 in the open positions 68. In some embodiments, the linkage 84 may be coupled to the first louver 80 via the first link 94, and the remaining louvers 64 may be coupled to the first louver 80 via the louver linkage 76.

The fire damper 30 may include a biasing mechanism 150 (e.g., an assembly of a spring 152 and rod 154, a pressurized hydraulic piston, another suitable force application device or mechanism) that applies a biasing force (e.g., a torque induced by the spring 152) on the first link 94 or onto another suitable link or component of the linkage 84. For example, the biasing mechanism 150 may include a biasing link 156 that is configured to transfer the biasing force generate by the spring 152 to the first link 94 (e.g., via the first pin 92) and, thus, the first louver 80. The biasing force may bias or load the first link 94 to force the louvers 64 toward the closed positions 70. In the connected state 138, the fuse link 100 may extend between the first link 94 and the second link 98 to transfer a load of the biasing force from the biasing link 156 to the actuator 82 (e.g., which may be coupled to the second link 98). The fuse link 100 enables the actuator 82 to counter-act the biasing force generated by the biasing mechanism 150 on the first link 94 and, therefore, to retain the louvers 64 in the open positions 68. Indeed, it should be understood that, even in the inactive state, the actuator 82 may impart a restraining force on the second link 98 that is sufficient to counter-act the biasing force that is transferred from the biasing mechanism 150 to the actuator 82 via the fuse link 100, for example.

Figure 7:
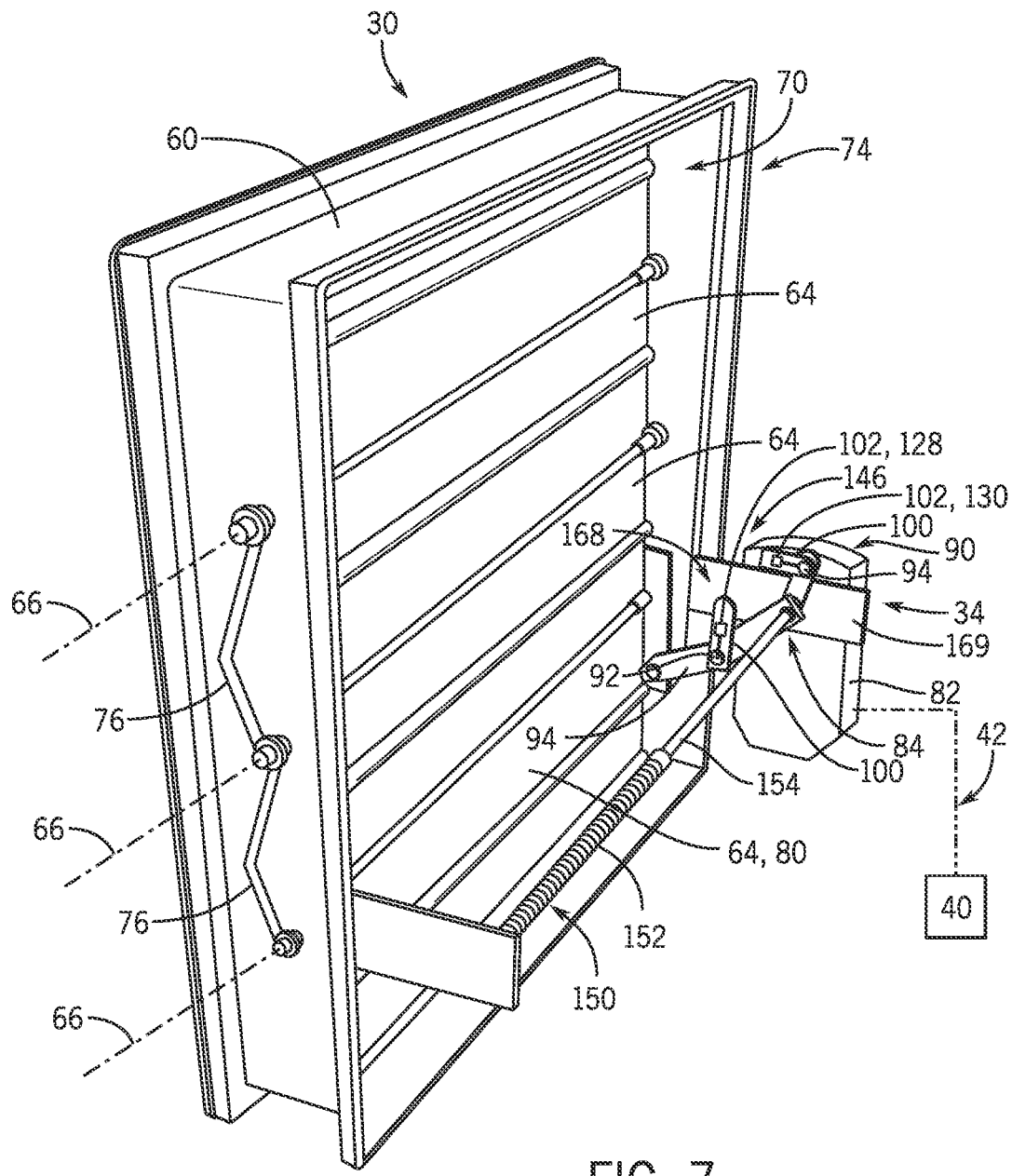
FIG. 7 is a perspective view of an embodiment of a damper and a damper inspection system, in accordance with an aspect of the present disclosure.

Generally, at least a portion of the fuse link 100 is made of a material that is configured to melt, plastically deform, or weaken upon application of thermal energy (e.g., heat) to the fuse link 100. In some embodiments, in response to exposure to a threshold temperature, physical properties of the fuse link 100 may be altered such that the force applied by the biasing mechanism 150 causes the fuse link 100 to plastically deform or rupture (e.g., break). Thus, the fuse link 100 may be separated into two or more separate pieces. For example, to better illustrate and to facilitate the following discussion, FIG. 7 is a perspective view of an embodiment of the fire damper 30 in which the fuse link 100 is in the disconnected state 146.

Upon rupture of the fuse link 100, the actuator 82 may no longer be able to counter-act (e.g., via the fuse link 100) the biasing force applied by the biasing mechanism 150 to the first link 94. Accordingly, upon rupture or other plastic deformation of the fuse link 100 (e.g., upon transition of the fuse link 100 from the connected state 138 to the disconnected state 146), the biasing mechanism 150 may transfer the biasing force to the louvers 64 to transition the louvers 64 from the open positions 68 to the closed positions 70. To this end, cooperation between the fuse link 100, the linkage 84, and the biasing mechanism 150 enables the fire damper 30 to automatically transition from the open configuration 72 to the closed configuration 74 in response to a temperature near the fire damper 30 exceeding the threshold temperature value. Upon rupture or other plastic deformation of the fuse link 100, the biasing mechanism 150 may move the linkage 84 such that the linkage 84 disengages (e.g., decouples) the first sensor section 128 of the fuse link sensor 102 from the second sensor section 130 of the fuse link sensor 102. As such, the linkage 84 may transition the fuse link sensor 102 to a disengaged configuration 168 (see FIG. 6).

The fuse link sensor 102, the actuator 82, or both, may collectively form at least a portion of the monitoring assembly 34. As discussed in detail herein, the fuse link sensor 102 and the actuator 82 may be electrically and/or communicatively coupleable to the remote controller 40 via the communication system 42 and configured to provide the remote controller 40 with feedback indicative of an operational status or operational parameters of the fire damper 30. As such, communication between the fuse link sensor 102, the actuator 82, and the remote controller 40 may facilitate performance of an inspection on the fire damper 30 via the damper inspection system 22.

It should be understood that, in some embodiments, the actuator 82 may be omitted from the fire damper 30. In such embodiments, the fuse link assembly 90 may be coupled to, for example, the first pin 92 and a support 169 of the frame 60, instead of the first pin 92 and the second pin 96.

Figure 8:
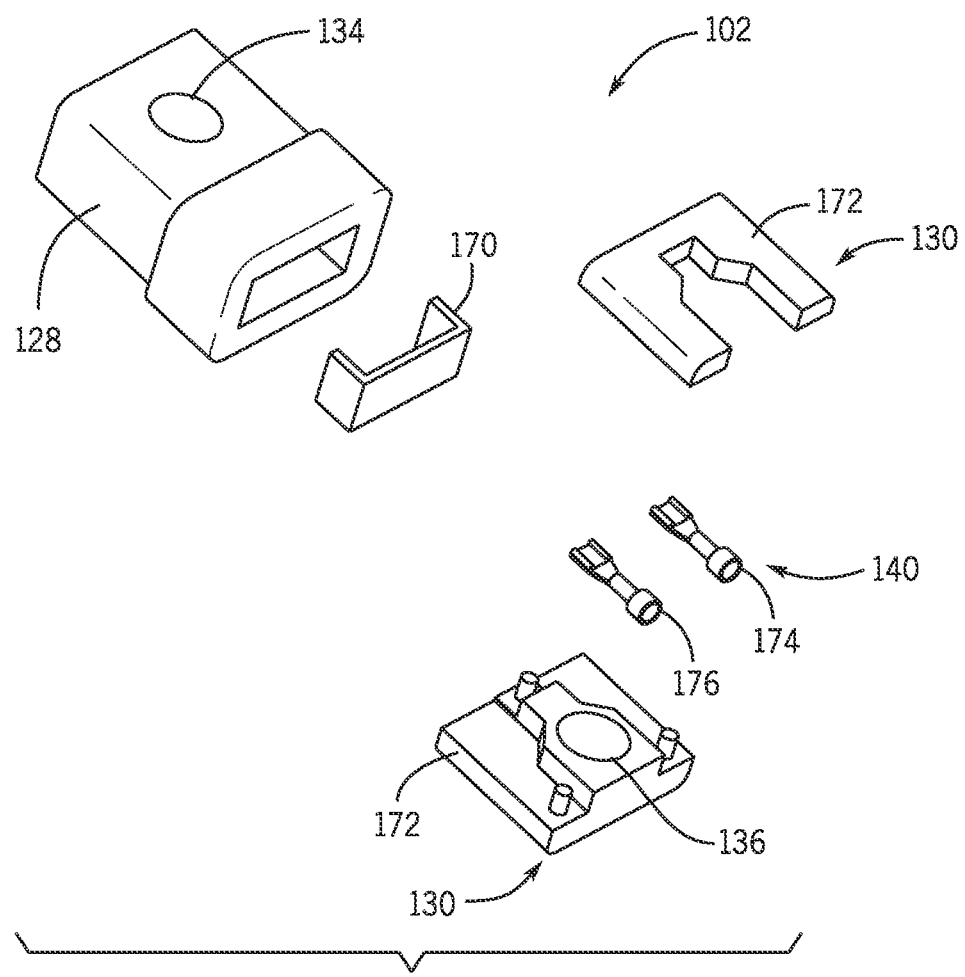
FIG. 8 is an exploded perspective view of an embodiment of a fuse link sensor that may be included in a damper inspection system, in accordance with an aspect of the present disclosure.

FIG. 8 is an exploded perspective view of an embodiment of the fuse link sensor 102. In the illustrated embodiment, the first sensor section 128 supports (e.g., receives, houses) a conductive bridge 170, which may be formed from a piece of metallic material (e.g., copper, aluminum, steel). The second sensor section 130 may be formed from sections 172 that support (e.g., receive, house) a first conductive contact 174 and a second conductive contact 176 (e.g., the connectors 140, a pair of prongs). In the engaged configuration 142 of the fuse link sensor 102 (see FIGS. 3 and 5), the first and second sensors sections 128, 130 are engaged with one another such that the first and second conductive contacts 174, 176 contact the conductive bridge 170. As such, the conductive bridge 170 may electrically couple the first conductive contact 174 to the second conductive contact 176 to establish electrical continuity between the first and second conductive contacts 174, 176. In the disengaged configuration 168 of the fuse link sensor 102 (see FIGS. 6 and 7), the first and second sensor sections 128, 130 may be separated from one another such that the conductive bridge 170 does not electrically couple the first and second conductive contacts 174, 176 to one another. That is, in the disengaged configuration 180 of the fuse link sensor 102, the conductive bridge 170 does not establish electrical continuity between the first and second conductive contacts 174, 176. As discussed below, the remote controller 40 may be configured to determine whether the fuse link 100 is in the connected state 138 or the disconnected configuration 168 based on a determination of whether the fuse link sensor 102 is the engaged configuration 142, in which there is electrical continuity between the first and second conductive contacts 174, 176, or the disengaged configuration 168, in which the first and second conductive contacts 174, 176 are electrically decoupled from one another such that there is no electrical continuity between the first and second conductive contacts 174, 176.

Figure 9:
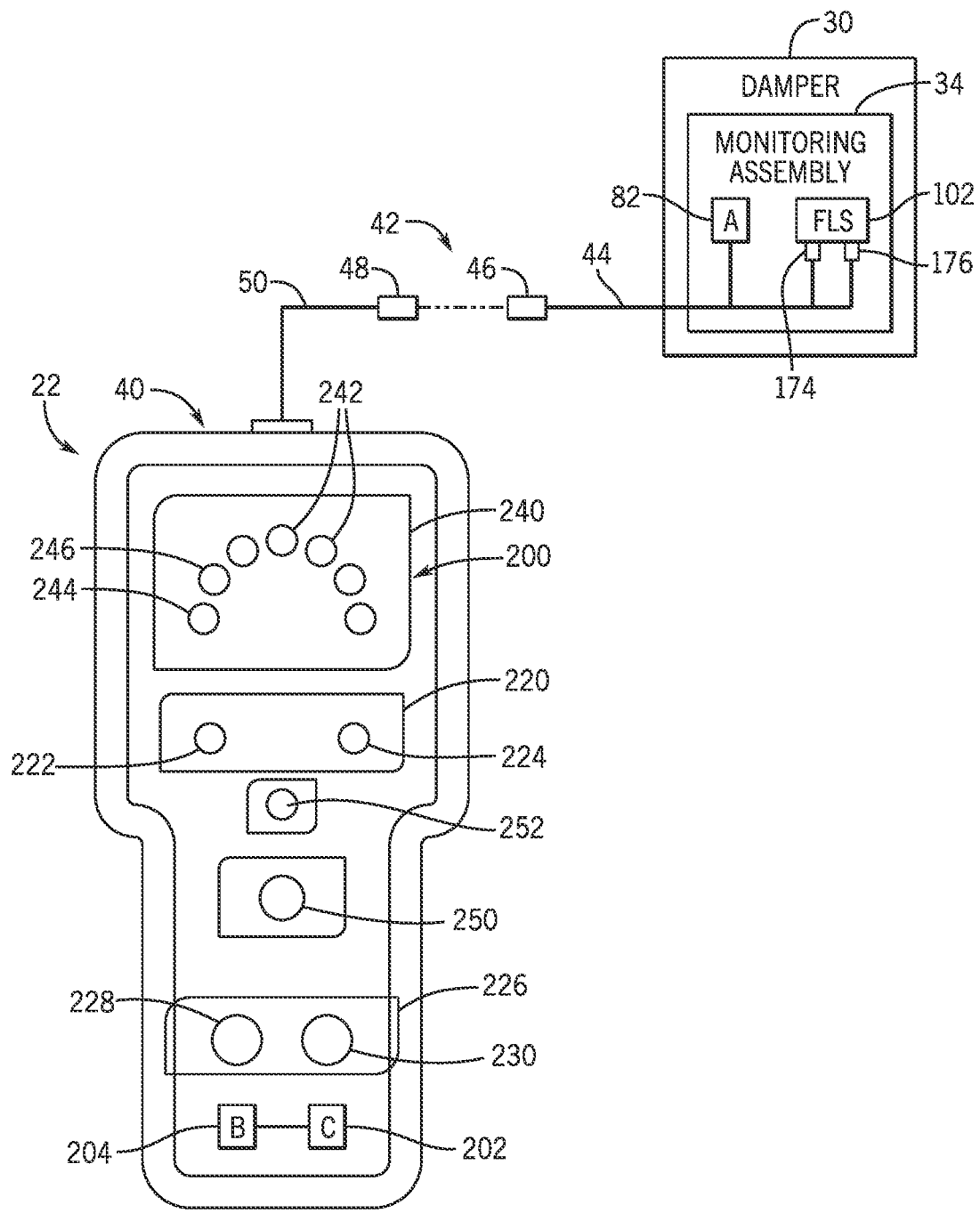
FIG. 9 is a schematic of an embodiment of a damper inspection system, in accordance with an aspect of the present disclosure.

The following discussion continues with reference to FIG. 9, which is a schematic of an embodiment of the damper inspection system 22. As discussed above, the remote controller 40 is configured to communicatively couple to the monitoring assembly 34 (e.g., the fuse link sensor 102, the actuator 82, or both) via the communication system 42. In the illustrated embodiment, the remote controller 40 includes a user interface 200 that may display feedback received from the monitoring assembly 34 and/or facilitate operating the components of the damper 30 based on user input (e.g., from a technical utilizing the remote controller 40). The user interface 200 may be communicatively coupled to control circuitry 202 of the remote controller 40, which may be configured to facilitate operating the damper inspection system 22 in accordance with the techniques discussed herein. In some embodiments, the control circuitry 202 may include analog circuitry. In other embodiments, the control circuitry 202 may include digital circuitry components (e.g., microprocessors) in addition to, or in lieu of, the analog circuitry.

In any case, the remote controller 40 may be configured to communicate with the fuse link sensor 102 (e.g., via the communication system 42) and utilize feedback received from the fuse link sensor 102 to determine whether the fuse link 100 is in the connected state 138 or the disconnected state 146. For example, in some embodiments, the control circuitry 202 may be electrically coupled to first conductive contact 174 and the second conductive contact 176 of the fuse link sensor 102 via the communication system 42. In response to a user input received at the user interface 200, the control circuitry 202 may send a test signal (e.g., an electrical current) to the first conductive contact 174 of the fuse link sensor 102, for example. As discussed above, when the fuse link 100 is in the connected state 138 on the linkage 84, the first pin 92 and the second pin 96 may be positioned to retain the fuse link sensor 102 in the engaged configuration 142, in which the conductive bridge 170 electrically couples the first conductive contact 174 to the second conductive contact 176. Accordingly, when the fuse link sensor 102 is in the engaged configuration 142, the second conductive contact 176 may receive the test signal from the first conductive contact 174 via the conductive bridge 170 and transmit the test signal back to the control circuitry 202 via the communication system 42. As such, the control circuitry 202 may determine that there is electrical continuity between the first conduct contact 174 and the second conductive contact 176 in response to receiving the test signal from the second conductive contact 176. In other words, the control circuitry 202 may determine that the fuse link sensor 102 is in a closed circuit arrangement, in which the first conductive contact 174 is electrically coupled to the second conductive contact 176 (e.g., via the conductive bridge 170) to establish electrical continuity between the first conductive contact 174 and the second conductive contact 176.

The control circuitry 202 may determine that the fuse link 100 is in the connected state 138 upon confirming electrical continuity between the first and second conductive contacts 174, 176 (e.g., upon determining that the fuse link sensor 102 is in the engaged configuration 142). In this way, a user of the remote controller 40 may verify that the first link 100 is in the connected state 138. In some embodiments, the remote controller 40 may include a battery 204 that is disposed within a housing of the remote controller 40 and is configured to provide the control circuitry 202 with an electrical current that is suitable for generating the test signal.

In certain embodiments, the control circuitry 202 may determine that the fuse link 100 is in the disconnected state 146 in response to determining that the there is no electrical continuity between the first conductive contact 174 and the second conductive contact 176. For example, as noted above, when the fuse link 100 is in the disconnected state 146 on the linkage 84, the first pin 92 and the second pin 96 may be positioned to retain the fuse link sensor 102 in the disengaged configuration 168, in which the conductive bridge 170 is spaced apart from and does not electrically couple the first conductive contact 174 to the second conductive contact 176. The control circuitry 202 may determine that the fuse link 100 is in the disconnected state 146 in response to transmitting the test signal to the first conductive contact 174 and determining that the test signal is not received at the second conductive contact 176. That is, the control circuitry 202 may determine that the fuse link 100 is in the disconnected state 146 in response to determining that the fuse link sensor 102 is in an open circuit arrangement, in which the first conductive contact 174 is electrically decoupled from the second conductive contact 176.

In certain embodiments, the control circuitry 202 may determine whether the fuse link 100 is in the connected state 138 or the disconnected state 146 based or a measured electrical resistivity between the first conductive contact 174 and the second conductive contact 176 of the fuse link sensor 102. For example, when the control circuitry 202 is electrically coupled to the fuse link sensor 102 (e.g., the communication system 42), the control circuitry 202 may measure a resistance value (e.g., in Ohms) between the first conductive contact 174 and the second conductive contact 176 (e.g., via integrated components of the control circuitry 202). The control circuitry 202 may determine that the fuse link 100 is in the connected state 138 in response to determining that a resistance value between the first conductive contact 174 and the second conductive contact 176 is relatively low (e.g., within an expected range indicative of the first conductive contact 174 being electrically coupled to the second conductive contact 176 and/or less than a threshold value). Conversely, the control circuitry 202 may determine that the fuse link 100 is in the disconnected state 146 in response to determining that a resistance value between the first conductive contact 174 and the second conductive contact 176 is relatively high (e.g., within an expected range indicative of the first conductive contact 174 being electrically decoupled to the second conductive contact 176 and/or above a threshold value).

In some embodiments, the user interface 200 includes a fuse link status indicator 220 that is configured to indicate whether the fuse link 100 is in the connected state 138 or the disconnected state 146. For example, in some embodiments, the control circuitry 202 may be configured to illuminate a first indicator 222 (e.g., a first light emitting diode [LED]) in response to determining that the fuse link 100 is in the connected state 138 and to illuminate a second indicator 224 (e.g., a second LED) in response to determining that the fuse link 100 is in the disconnected state 146. Additionally or alternatively, the control circuitry 202 may illuminate one of more indicators of the fuse link status indicator 220 in a particular color based on the connection state (e.g., connected, disconnected) of the fuse link 100. As a non-limiting example, the control circuitry 202 may instruct the first indicator 222 to illuminate in a first color (e.g., green) in response to determining that the fuse link 100 is in the connected state 138 and may instruct the first indicator 222 to illuminate in a second color (e.g., red) in response to determining that the fuse link 100 is in the disconnected state 146. Additionally or alternatively, the control circuitry 202 may control certain components of the remote controller 40 to output an audio message or other suitable alert that conveys the connection state of the fuse link 100 to a user (e.g., a technician) utilizing the remote controller 40. In this way, the remote controller 40 may be utilized by the user to perform a remote inspection of the fire damper 30 to determine the connection state of the fuse link 100.

In some embodiments, the remote controller 40 may be utilized to determine a position of, to adjust the position of, and/or to verify a range of motion of the actuator 82 and/or of the louvers 64 coupled to the actuator 82 (e.g., via the linkage 84). For example, in response to user input received at a damper control interface 226 (e.g., buttons, knobs, dials) of the user interface 200, the control circuitry 202 may send a control signal (e.g., an electrical current) to the actuator 82 to adjust a position of the actuator 82. For clarity, as used herein, the "position of the actuator 82" may be indicative of a position of an output shaft or component of the actuator 82 and/or of a position of the louvers 64 relative to the frame 60.

In some embodiments, the control circuitry 202 may output a control signal instructing the actuator 82 to transition the louvers 64 toward the open positions 68 upon receiving a user input at a first button 228 (e.g., a first user input device) of the damper control interface 226. Conversely, the control circuitry 202 may output a control signal instructing the actuator 82 to transition the louvers 64 toward the closed positions 70 upon receiving a user input at a second button 230 (e.g., a second user input device) of the damper control interface 226. The control circuitry 202 may generate the control signal based on electrical power provided by the battery 204.

In some embodiments, the actuator 82 may be configured to output a return signal (e.g., an electrical output, an analog signal) that corresponds to the position of the actuator 82. The control circuitry 202 may be configured to receive the return signal (e.g., via the communication system 42) and to determine the current position of the actuator 82 based on the return signal. As a non-limiting example, the control circuitry 202 may determine the current position of the actuator 82 based on a voltage magnitude of the return signal. For example, in some embodiments, the actuator 82 may output a return signal having a voltage value that varies based on a degree of opening (e.g., a current position of the actuator 82 relative to a baseline position) of the actuator 82. As such, the actuator 82 may output a return signal having a first threshold voltage value (e.g., a relatively low voltage value) while the actuator 82 is in a first position, for example, in which the louvers 64 are in the closed positions 70. Conversely, the actuator 82 may output a return signal having a second threshold voltage value (e.g., a relatively high voltage value) while the actuator 82 is in a second position, for example, in which the louvers 64 are in the open positions 68.

In some embodiments, the control circuitry 202 may be configured to display an indication of the position of the actuator 82 (e.g., the current degree of opening of the actuator 82) via a position indication interface 240 of the user interface 200. For example, in some embodiments, the position indication interface 240 may include a plurality of indicators 242 (e.g., LEDs) that correspond to respective positions of the actuator 82. Particularly, each of the indicators 242 may correspond to a current degree of opening of the actuator 82 (e.g., as defined by a current position of the actuator 82). For example, a first indicator 244 may correspond to a first degree of opening of the actuator 82, in which the position of the actuator 82 is offset from a baseline position of the actuator 82 by a first angular increment. A second indicator 246 may correspond to a second degree of opening of the actuator 82, in which the position of the actuator 82 is offset from the baseline position of the actuator 82 by a second angular increment (e.g., an angular increment that is larger than the first angular increment), and so forth.

The control circuitry 202 may illuminate certain of the indicators 242 based on the current position (e.g., the current degree of opening) of the actuator 82. For example, the control circuitry 202 may illuminate none of the indicators 242 in response to determining that the actuator 82 is at a first position (e.g., the baseline position), in which the actuator 82 may position the louvers 64 in the closed positions 70. The control circuitry 202 may illuminate all of the indicators 242 in response to determining that the actuator 82 is at a second position, in which the actuator 82 may position louvers 64 in the open positions 68. The control circuitry 202 may illuminate a subset of the indicators 242 (e.g., the first indicator 244, the second indicator 246, one or more additional indicators, etc.) in response to determining that the actuator 82 is a third position, in which the louvers 64 are disposed in intermediate positions between the closed positions 70 and the open positions 68. It should be understood that, in other embodiments, the position indicator interface 240 may include any other suitable display, audio device (e.g., a speaker), or other component of the remote controller 40 that is configured to indicate the position of the actuator 82 to the user.

In some embodiments, the user interface 200 may include a power button 250 for activating and deactivating the remote controller 40. Moreover, the user interface 200 may include a power indicator 252 that is configured to indicate whether the remote controller 40 is in an operational state (e.g., active/on) or in a non-operational state (e.g., inactive/off).

Figure 10:
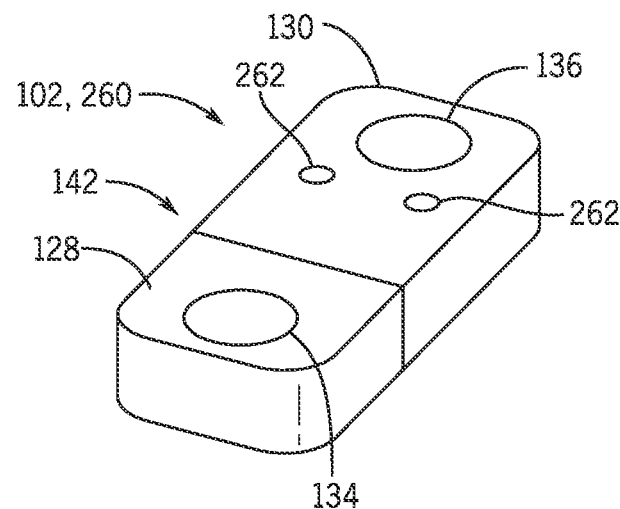
FIG. 10 is a perspective view of an embodiment of a fuse link sensor that may be included in a damper inspection system, in accordance with an aspect of the present disclosure.
Figure 11:
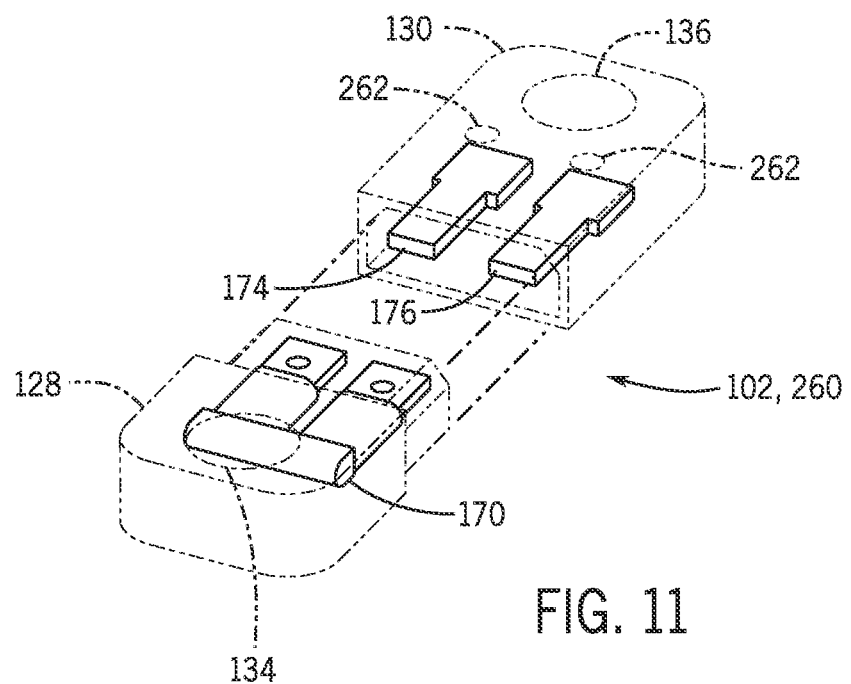
FIG. 11 is a perspective view of an embodiment of a fuse link sensor that may be included in a damper inspection system, in accordance with an aspect of the present disclosure.

FIGS. 10 and 11 are perspective views of another embodiment of the fuse link sensor 102, referred to herein as the fuse link sensor 260, and will be discussed concurrently below. In the illustrated embodiment, the conductive bridge 170 is disposed in the first sensor section 128. The first conductive contact 174 and the second conductive contact 176 are disposed in the second sensor section 130. As such, in the engaged configuration 142 of the fuse link sensor 102 (see FIG. 10), the first sensor section 128 and the second sensor section 130 may encapsulate the conductive bridge 170, the first conductive contact 174, and the second conductive contact 176. One or more channels 262 may extend through a body of the second sensor section 130 and enable wires of the communication system 42 to couple to the first conductive contact 174 and the second conductive contact 176.

Further, it should be understood that, in certain embodiments, the first conductive contact 174 may be disposed in the first sensor section 128 and the second conductive contact 176 may be disposed in the second sensor section 130. In such embodiments, the first conductive contact 174 may be configured to electrically couple to the second conductive contact 176 in the engaged configuration 142 of the fuse link sensor 260 and may be electrically decoupled from the second conductive contact 176 in the disengaged configuration 168 of the fuse link sensor 260. Accordingly, in such embodiments, the conductive bridge 170 may be omitted from the fuse link sensor 260.

Figure 12:
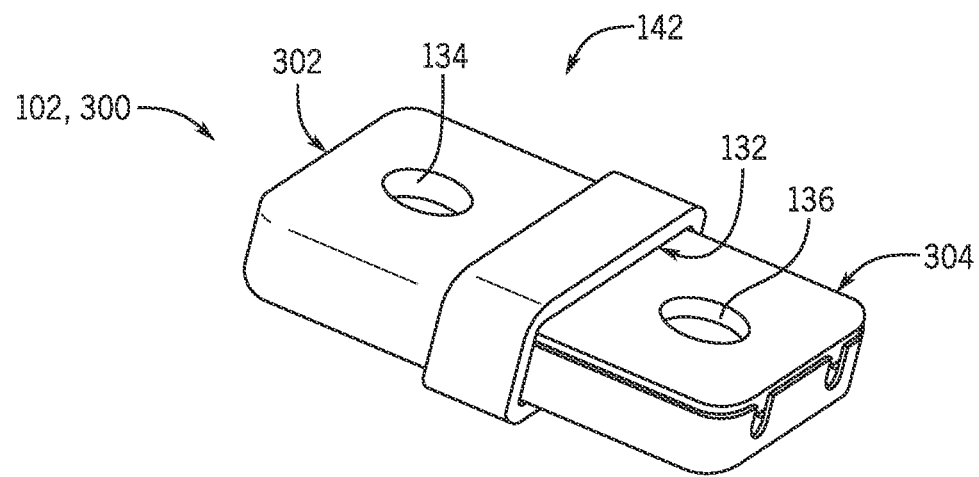
FIG. 12 is a perspective view of an embodiment of a fuse link sensor that may be included in a damper inspection system, in accordance with an aspect of the present disclosure.
Figure 13:
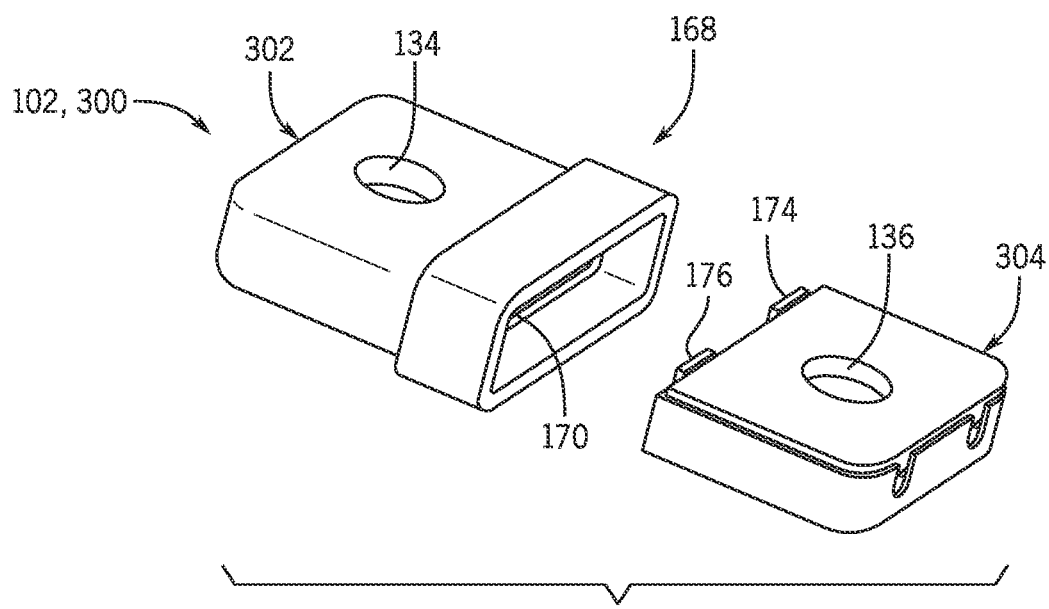
FIG. 13 is a perspective view of an embodiment of a fuse link sensor that may be included in a damper inspection system, in accordance with an aspect of the present disclosure.
Figure 14:
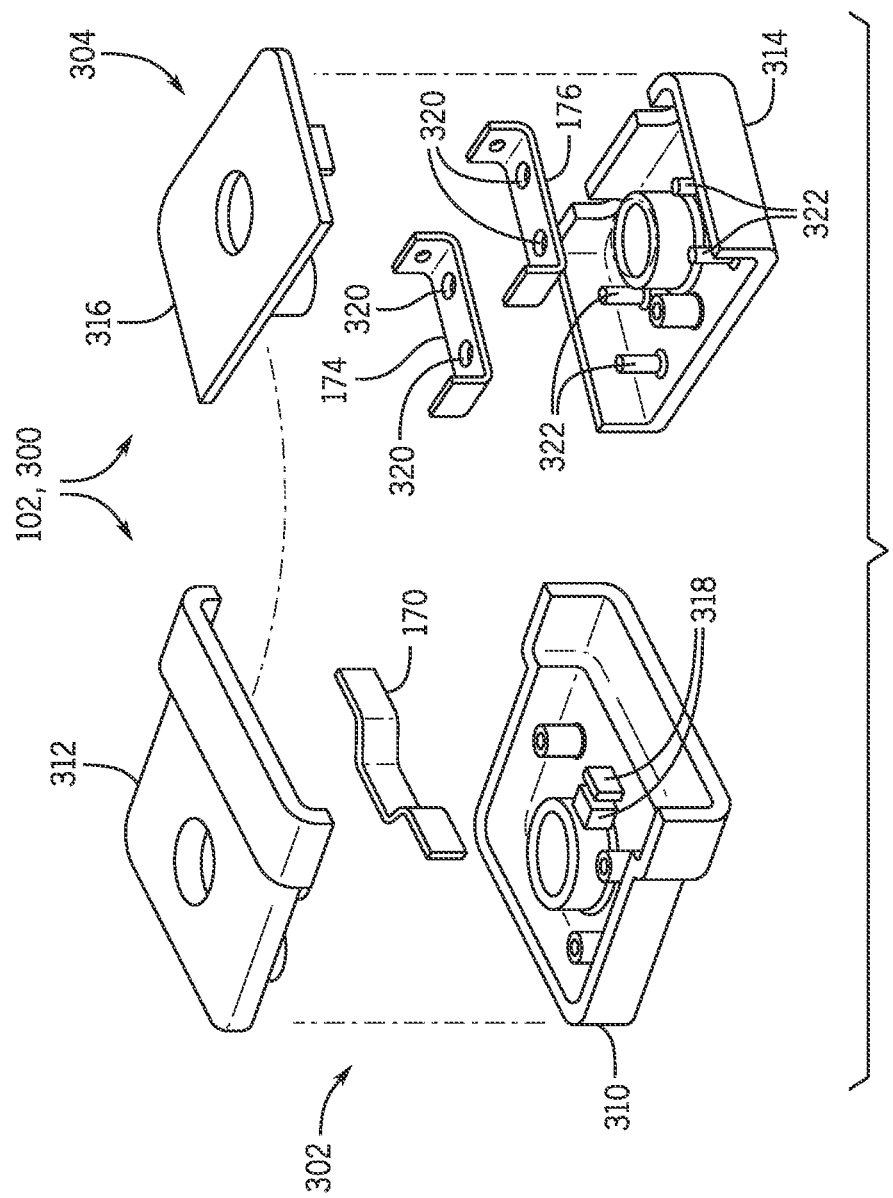
FIG. 14 is an exploded perspective view of an embodiment of a fuse link sensor that may be included in a damper inspection system, in accordance with an aspect of the present disclosure.

FIGS. 12 and 13 are perspective views of another embodiment of the fuse link sensor 102, referred to herein as the fuse link sensor 300. FIG. 14 is an exploded view of the fuse link sensor 300. FIGS. 12, 13, and 14 will be discussed concurrently below. The fuse link sensor 300 may include a first body portion 302 (e.g., the first sensor section 128) and a second body portion 304 (e.g., the second sensor section 130). The first body portion 302 and the second body portion 304 may be configured to removably couple to one another (e.g., at the interface 132) to enable the fuse link sensor 300 to transition between the engaged configuration 142 (see FIG. 12) and the disengaged configuration 168 (see FIG. 13). The first body portion 302 may be configured to removably couple to the second body portion 304 via a snap fit, an interference fit, fasteners, adhesives, or via another suitable mechanism or technique.

In the illustrated embodiment of FIG. 14, the first body portion 302 of the fuse link sensor 300 include a first chassis section 310 and a second chassis section 312 configured to couple to one another. The second body portion 304 includes a third chassis section 314 and a fourth chassis section 316 configured to couple to one another. The first and/or second chassis sections 310, 312 may be configured to receive and support the conductive bridge 170. For example, the conductive bridge 170 may be disposed between a set of prongs 318 formed on first chassis section 310 and configured to support (e.g., via an interference fit) the conductive bridge 170. In other embodiments, the conductive bridge 170 may be coupled to the first and/or second chassis structures 310, 312 in another suitable manner. The third and/or fourth chassis sections 314, 316 may be configured to receive the first conductive contact 174 and the second conductive contact 176. For example, in some embodiments, the first and second conductive contacts 174, 176 may include apertures 320 formed therein that may be configured to engage with respective pillars 322 of the third chassis section 314 to facilitate coupling of the first and second conductive contacts 174, 176 to the third chassis section 314.

Figure 15:
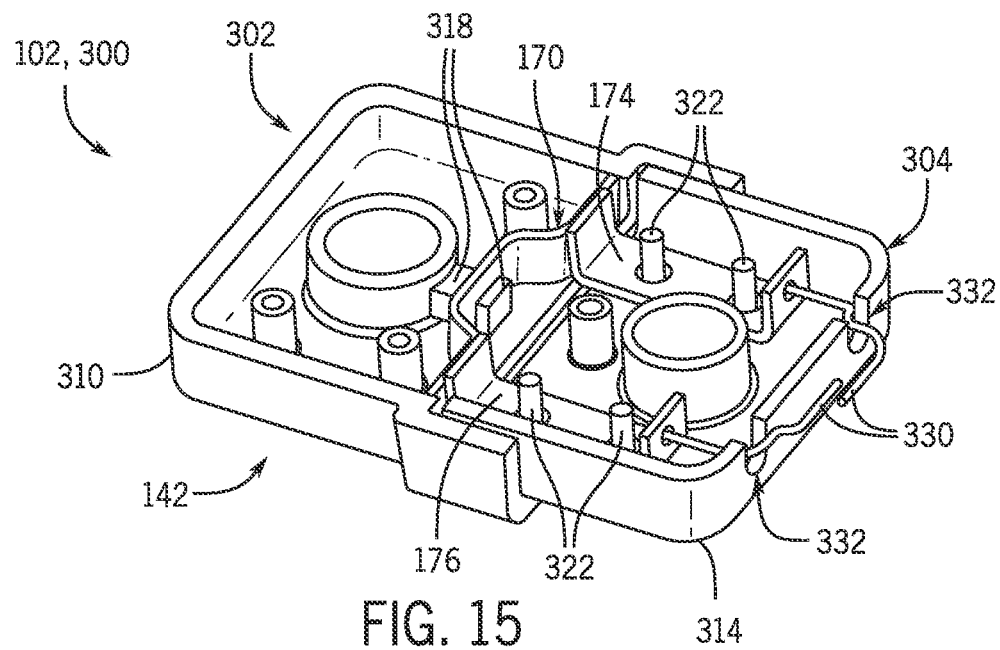
FIG. 15 is a perspective view of an embodiment of a portion of a fuse link sensor that may be included in a damper inspection system, in accordance with an aspect of the present disclosure.
Figure 16:
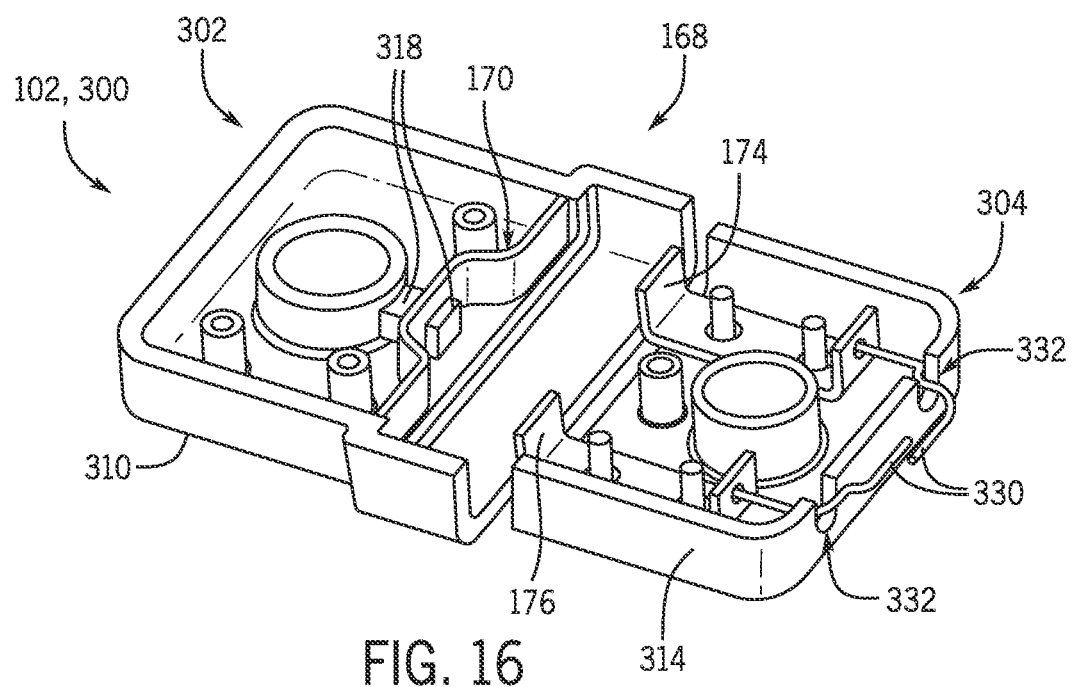
FIG. 16 is a perspective view of an embodiment of a portion of a fuse link sensor that may be included in a damper inspection system, in accordance with an aspect of the present disclosure.

FIG. 15 is a perspective via of an embodiment of a portion of the fuse link sensor 300 in the engaged configuration 142. FIG. 16 is a perspective via of an embodiment of a portion of the fuse link sensor 300 in the disengaged configuration 168. To better illustrate certain components of the fuse link sensor 300, the second chassis section 312 and the fourth chassis section 316 are removed from the fuse link sensor 300 in the illustrated embodiments of FIGS. 15 and 16. FIGS. 15 and 16 will be discussed concurrently below.

In the engaged configuration 142 of the fuse link sensor 300 (see FIG. 15), the first and second body portions 302, 304 are engaged with one another such that the first and second conductive contacts 174, 176 contact the conductive bridge 170. As such, the conductive bridge 170 may electrically couple the first conductive contact 174 to the second conductive contact 176 to establish electrical continuity between the first and second conductive contacts 174, 176. In the disengaged configuration 168 of the fuse link sensor 102 (see FIG. 16), the first and second body portions 302, 304 may be separated from one another such that the conductive bridge 170 does not electrically couple the first and second conductive contacts 174, 176 to one another. That is, in the disengaged configuration 180 of the fuse link sensor 102, the conductive bridge 170 does not establish electrical continuity between the first and second conductive contacts 174, 176. In accordance with the techniques discussed above, the remote controller 40 may be configured to determine whether the fuse link 100 is in the connected state 138 or the disconnected configuration 168 based on a determination of whether the fuse link sensor 102 is the engaged configuration 142, in which there is electrical continuity between the first and second conductive contacts 174, 176, or the disengaged configuration 168, in which the first and second conductive contacts 174, 176 are electrically decoupled from one another such that there is no electrical continuity between the first and second conductive contacts 174, 176. In some embodiments, the remote controller 40 may be configured to electrically couple to the first and second conductive contacts 174, 176 via wires 330 extending through apertures 332 in the second body portion 304.

As set forth above, embodiments of the present disclosure may provide one or more technical effects useful for enabling a remote inspection of a damper (e.g., a fire damper) via utilization of a damper inspection system. The damper inspection system disclosed herein enables a technical to verify the operational functionality of a damper and/or adjust operation of a damper (e.g., utilizing a remote controller of the damper inspection system), without having to travel to a location of the damper to physically interact with (e.g., adjust, manipulate) the damper and/or visually inspect the damper itself. The technical effects and technical problems in the specification are examples and are not limiting. It should be noted that the embodiments described in the specification may have other technical effects and can solve other technical problems.

While only certain features and embodiments have been illustrated and described, many modifications and changes may occur to those skilled in the art, such as variations in sizes, dimensions, structures, shapes and proportions of the various elements, values of parameters, such as temperatures and pressures, mounting arrangements, use of materials, colors, orientations, and so forth, without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure.

Furthermore, in an effort to provide a concise description of the exemplary embodiments, all features of an actual implementation may not have been described, such as those unrelated to the presently contemplated best mode, or those unrelated to enablement. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A damper inspection system for a heating, ventilating, and air conditioning (HVAC) system, comprising:
a fuse link sensor configured to couple to a damper and comprising a first contact and a second contact, wherein the fuse link sensor is configured to transition between an engaged configuration in which the first contact is electrically coupled to the second contact and a disengaged configuration in which the first contact is electrically decoupled from the second contact; and
a remote controller comprising control circuitry configured to electrically couple to the first contact and the second contact and to output an indication of an operational status of a fuse link coupled to a linkage of the damper based on an electrical continuity between the first contact and the second contact.

2. The damper inspection system of claim 1, wherein the control circuitry is configured to:
transmit a test signal to the first contact;
determine that the fuse link is intact in response to receiving the test signal via the second contact; and
determine that the fuse link is ruptured in response to determining that the test signal is not received via the second contact.

3. The damper inspection system of claim 2, wherein the remote controller is a portable device configured to electrically couple to the fuse link sensor via a harness, wherein the control circuitry is configured to transmit the test signal to the first contact via the harness and to receive the test signal via the second contact via the harness.

4. The damper inspection system of claim 2, wherein the remote controller comprises a battery electrically coupled to the control circuitry, wherein the control circuitry is configured to generate the test signal with electrical power received from the battery.

5. The damper inspection system of claim 1, wherein the control circuitry is configured to:
transmit a control signal to an actuator of the damper to adjust a position of the actuator;
receive a return signal from the actuator indicative of the position of the actuator; and
determine the position of the actuator based on the return signal.

6. The damper inspection system of claim 5, wherein the remote controller comprises a user interface configured to display an additional indication indicative of the position of the actuator.

7. The damper inspection system of claim 1, wherein the fuse link sensor comprises:
a first body portion comprising a conductive bridge; and
a second body portion comprising the first contact and the second contact, wherein the first body portion is configured to engage with the second body portion in the engaged configuration of the fuse link sensor to establish the electrical continuity between the first contact and the second contact via the conductive bridge, and wherein the first body portion is configured to disengage from the second body portion in the disengaged configuration of the fuse link sensor to separate the conductive bridge from the first contact and the second contact and disrupt the electrical continuity.

8. The damper inspection system of claim 7, wherein the first body portion and the second body portion are configured to encapsulate the conductive bridge, the first contact, and the second contact in the engaged configuration of the fuse link sensor.

9. The damper inspection system of claim 1, wherein the fuse link sensor is configured to couple to the linkage of the damper, wherein the fuse link sensor is configured to transition from the engaged configuration to the disengaged configuration in response to movement of the linkage induced by a biasing mechanism of the damper upon rupture of the fuse link.

10. A heating, ventilating, and air conditioning (HVAC) system, comprising:

a damper, comprising:
- a fuse link sensor coupled to a linkage of the damper, wherein a first body portion of the fuse link sensor is engaged with a second body portion of the fuse link sensor in an engaged configuration of the fuse link sensor; and
- a fuse link coupled to the linkage, wherein the fuse link is configured to rupture to enable the linkage to disengage the first body portion from the second body portion to transition the fuse link sensor to a disengaged configuration; and
- a remote controller comprising control circuitry configured to output an indication that the fuse link is in a ruptured state in response to a determination that the fuse link sensor is in the disengaged configuration.

11. The HVAC system of claim 10, comprising the linkage of the damper, wherein the linkage is configured to drive separation of the first body portion from the second body portion to transition the fuse link sensor from the engaged configuration to the disengaged configuration upon rupture of the fuse link.

12. The HVAC system of claim 10, wherein the fuse link sensor comprises a first contact and a second contact, wherein the first contact and the second contact are electrically coupled to one another in the engaged configuration of the fuse link sensor and are electrically decoupled from one another in the disengaged configuration of the fuse link sensor, wherein the control circuitry is configured to send a test signal to the first contact to determine an electrical continuity between the first contact and the second contact, and wherein the control circuitry is configured to determine that the fuse link sensor is in the engaged configuration or in the disengaged configuration based on the electrical continuity.

13. The HVAC system of claim 12, wherein the first contact and the second contact are disposed in the first body portion, and wherein the fuse link sensor comprises a conductive bridge disposed in the second body portion and configured to electrically couple the first contact to the second contact in the engaged configuration of the fuse link sensor.

14. The HVAC system of claim 10, comprising an actuator coupled to the linkage and configured to actuate the linkage to transition one or more damper blades of the damper between open configurations and closed configurations, wherein the actuator is configured to output an analog signal indicative of a position of the actuator, the one or more damper blades, or both, and wherein the control circuitry is configured to receive the analog signal and output an indication indicative of the position of the actuator, the one or more damper blades, or both, based on the analog signal.

15. The HVAC system of claim 14, wherein the remote controller comprises a battery electrically coupled to the control circuitry, wherein the control circuitry is configured to power the actuator via an electrical current supplied to the actuator by the battery.

16. The HVAC system of claim 10, comprising the linkage, wherein the linkage is coupled to one or more damper blades of the damper and is configured to transfer a force from an actuator of the damper to the one or more damper blades, wherein the linkage comprises a first pin extending from a first link of the linkage and a second pin extending from a second link of the linkage, wherein the fuse link and the fuse link sensor are coupled to and extend between the first pin and the second pin.

17. The HVAC system of claim 10, wherein the fuse link is configured to rupture in response to a temperature of the fuse link exceeding a threshold temperature value to transition from a connected state to the ruptured state.

18. A damper inspection system for a heating, ventilating, and air conditioning (HVAC) system, comprising:
- a fuse link sensor configured to transition from an engaged configuration to a disengaged configuration upon rupture of a fuse link of a damper;
- a communication port electrically coupled to the fuse link sensor and configured to couple to a support structure; and
- a remote controller configured to electrically couple to the fuse link sensor via the communication port, wherein the remote controller comprises control circuitry configured to instruct, via the communication port, an indicator to output an indication of a connection state of the fuse link based on feedback from the fuse link sensor.

19. The damper inspection system of claim 18, wherein the fuse link sensor comprises a first contact and a second contact configured to be in electrical communication with one another in the engaged configuration of the fuse link sensor and to be electrically disconnected from one another in the disengaged configuration of the fuse link sensor, wherein the control circuitry is configured to transmit a test signal to the first contact to determine an electrical continuity between the first contact and the second contact, and wherein the feedback comprises the electrical continuity.

20. The damper inspection system of claim 18, wherein the control circuitry is configured to:
- receive additional feedback from an actuator of the damper via the communication port; and
- indicate a degree of opening of the damper via a user interface of the remote controller based on the additional feedback.

* * * * *